United States Patent [19]

Konopka

[11] Patent Number: 4,805,083
[45] Date of Patent: Feb. 14, 1989

[54] LOW COST AUTOMATIC VOLTAGE DOUBLER SWITCH

[75] Inventor: John G. Konopka, Barrington, Ill.

[73] Assignee: Zenith Electronics Corporation, Glenview, Ill.

[21] Appl. No.: 238,438

[22] Filed: Aug. 30, 1988

Related U.S. Application Data

[63] Continuation-in-part of Ser. No. 213,665, Jun. 30, 1988, abandoned.

[51] Int. Cl.[4] ............................................. H02M 7/10
[52] U.S. Cl. ..................................... 363/143; 363/50; 363/126; 323/300
[58] Field of Search ..................... 363/49–50, 363/59–61, 85–86, 126, 142, 143; 323/299, 300, 325, 901

[56] References Cited

U.S. PATENT DOCUMENTS

| | | | |
|---|---|---|---|
| 4,608,500 | 8/1986 | Togawa | 323/300 |
| 4,654,538 | 3/1987 | Lethellier | 363/143 |
| 4,658,345 | 4/1987 | Ingman | 363/143 |
| 4,665,323 | 5/1987 | Russell et al. | 323/300 |

*Primary Examiner*—Peter S. Wong

[57] ABSTRACT

An automatic voltage doubler switch includes a triac for converting a rectifier arrangement from a direct to a doubler mode of operation. Drive current for the triac is supplied by a resistor and capacitor circuit connected across one of the rectifiers in the bridge network. A self-biasing SCR trigger circuit senses the AC line voltage and has its anode and cathode coupled across the capacitor. When the AC line rises to a predetermined level, the SCR fires and shorts out the capacitor to render the triac nonconductive. The capacitor delays drive current on start up until the SCR trigger can sense the AC line voltage. The capacitor also maintains the triac conductive during opposite polarities of the AC line. The capacitor also maintains the SCR in conduction during phase reversals of the AC line. A switchable RC delay is activated only during the voltage doubler mode to delay operation of the SCR trigger.

8 Claims, 1 Drawing Sheet

4,805,083

LOW COST AUTOMATIC VOLTAGE DOUBLER SWITCH

This application is a Continuation-in-Part of application Ser. No. 213,665, filed 6/30/88, now abandoned.

BACKGROUND OF THE INVENTION

This invention relates in general to AC power supplies and specifically to automatic voltage doubler circuits for such power supplies.

U.S. Pat. No. 4,665,323, entitled ELECTRONICALLY SWITCHABLE POWER SOURCE issued May 12, 1987 in the names of R. Russell, W. Salata and D. Stevens and assigned to Zenith Electronics Corporation, describes a DC power source that automatically adapts to either a 120 volt AC or a 240 volt AC line input to produce a single range of regulated output voltage. The patented circuit utilizes a plurality of comparators for determining when the circuit should switch to the voltage doubler mode. It includes a triac that is supplied with a DC trigger voltage for switching between the two operating modes.

In Ser. No. 101,117, filed 9/25/87, now U.S. Pat. No. 4,783,729, entitled AUTOMATIC VOLTAGE DOUBLER SWITCH, in the name of John Konopka and assigned to Zenith Electronics Corporation, a circuit arrangement for accomplishing substantially the same result as the patented circuit, but with significantly fewer parts, is described and claimed. That circuit utilizes a triac that is supplied with short duration, high energy trigger pulses from a relaxation oscillator for operating a power supply in its voltage doubler mode, with the oscillator being inhibited when the power supply is operated in the direct mode.

The present invention, while accomplishing the same result as the patented circuit and the circuit of the copending application, does so in a different manner with still fewer parts and includes a desirable response delay in the presence of line surges while operating in the doubler mode. A feature of the present invention circuit is use of one of the rectifiers in the supply bridge rectifier network to supply operating voltage for an SCR trigger that senses the AC line voltage to disable the triac drive when a predetermined line voltage is reached.

OBJECTS OF THE INVENTION

A principal object of the invention is to provide a novel automatic voltage doubler switch.

Another object of the invention is to provide an automatic voltage doubler switch for a power supply that is simple, economical and more effective under line surges than prior art devices.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
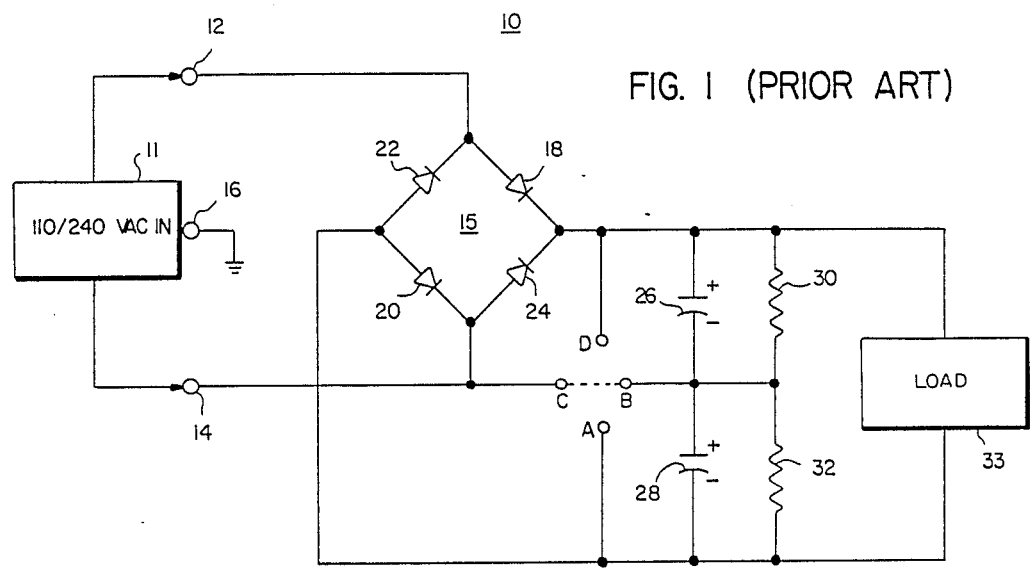
FIG. 1 is a partial schematic diagram of a prior art DC power supply that is operable in either a direct voltage mode or a voltage doubler mode.

In FIG. 1, a two mode power supply, generally designated by the reference numeral 10, is connectable to a source of AC line voltage 11. AC line voltage 11 may comprise either 120 volts AC or 240 volts AC connected across a pair of input terminals 12 and 14 of a bridge rectifier arrangement 15. A ground terminal 16 generally indicates a chassis ground. Rectifier arrangement 15 comprises four power diodes 18, 20, 22 and 24 connected in a conventional bridge configuration, with the anode of diode 18 and the cathode of diode 22 being connected to input terminal 12 and the anode of diode 24 and the cathode of diode 20 connected to input terminal 14. The anodes of diodes 20 and 22 are connected together at terminal A which forms the common return connection for the power supply load 33. The cathodes of diodes 18 and 24 are connected together and form the positive output terminal of the power supply (terminal D) and are connected to a series arrangement of capacitors 26 and 28 that is bridged by series connected resistors 30 and 32. The junction of the resistors and the capacitors is connected to a terminal B. Input terminal 14 is connected to a terminal C, which is connectable to terminal B, as indicated by the dashed line between terminals C and B. Load 33 is connected across resistors 30 and 32.

The operation of power supply 10 is relatively straightforward. With terminals B and C disconnected from each other, the direct operating mode is achieved. Assuming a positive voltage at input terminal 12, the current flow is through diode 18, capacitors 26 and 28 in series, diode 20 and back to input terminal 14. If a negative voltage is present at input terminal 12 and a positive voltage at input terminal 14, positive current flows from input terminal 14, through diode 24, capacitors 26 and 28, diode 22 and back to input terminal 12. Thus the voltage across load 33 is the peak of the AC voltage supplied to the input terminals 12 and 14. With terminals B and C shorted, the voltage doubler mode is achieved. In that instance, with a positive potential at input terminal 12, current flow traverses diode 18, capacitor 26, the B-C connection and input terminal 14. With reverse polarity, current flow is from input terminal 14, through the B-C connection, capacitor 28 and diode 22 back to input terminal 12. Thus the peak voltage of the source 11 appears across each of the capacitors 26 and 28 and adds to form a doubled voltage output. The above-identified patented circuit and circuit of the copending application are effective for making a conductive connection between terminals B and C when the voltage doubler mode is desired. The circuit of the invention makes this conductive connection between terminals B and C to initiate the voltage doubler operational mode with simple, reliable apparatus that is also compact and highly cost effective.

Figure 2:
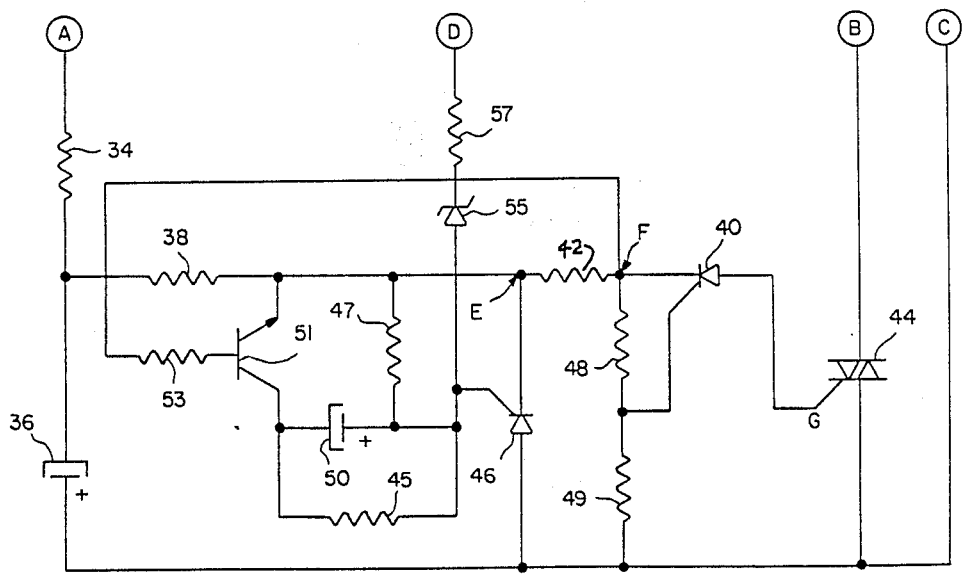
FIG. 2 is a schematic diagram of the electronic switch of the invention for use with the power supply of FIG. 1.

In FIG. 2, terminals A, B, C and D are shown. Terminal A is connected to a resistor 34, which is connected in series with a capacitor 36 that is returned to terminal C. Thus resistor 34 and capacitor 36 are directly connected across terminals A and C and are therefore connected in series across the AC line with diode 22 of bridge 15. The result is that a negative pulsating DC potential of approximately −10 volt RMS is developed across capacitor 36. The junction of resistor 34 and the negative terminal of capacitor 36 is connected through a resistor 38 to a junction E. Also connected to junction E are the cathode of an SCR 46, resistors 42 and 47 and the emitter of an NPN transistor 51. The anode of SCR 46 is connected to the positive terminal of capacitor 36, which is terminal C. Terminal D is connected to a resistor 57 that is connected in series with the cathode of a zener diode 55, that in turn has its anode connected to the gate of SCR 46 and to the junction of a resistor 45, a capacitor 50 and the other end of a small value resistor 47 (about 1K ohm). Resistor 45 has a large value (on the order of 470K ohms) and is connected across capacitor 50 and to the collector of transistor 51, the base of which is connected, through a resistor 53, to a junction F. Also connected to junction F are the other end of resistor 42, a resistor 48 and the cathode of an SCR 40. A resistor 49 is connected in series with resistor 48 and their junction is connected to the gate of SCR 40. The anode of SCR 40 is connected to the gate of a triac 44 that is connected between terminals B and C. It is thus seen that upon conduction of triac 44, terminals B and C are shorted together as mentioned.

Triac 44 requires a gate current of 10 ma for reliable conduction. To develop such a drive current under low line voltage conditions (approximately 85 volts AC) would necessitate a very large current capability for resistor 34, and not be cost effective. The provision of capacitor 36 and SCR 40 permits capacitor 36 to charge up and trigger SCR 40 to deliver the needed gate current to triac 44. Capacitor 36 also serves to delay application of drive to triac 44 until the SCR trigger (SCR 46) has had an opportunity to sense the voltage of the AC line. This assures that the system stays in the direct mode until it is certain that the doubler mode is required.

The zener diode 55 in the SCR trigger circuit is for temperature compensation. The trigger circuit is in series with bridge rectifier 18 and terminal C as follows: input terminal 12, rectifier 18, resistor 57, zener diode 55 (the gate of SCR 46), resistor 47 (the cathode of SCR 46), resistor 38, and capacitor 36 to input terminal 14. The arrangement of resistor 47 provides a self-bias connection such that SCR 46 is triggered into conduction when the voltage at terminal 12 reaches a predetermined level.

A trigger delay is also provided to enable the system to ignore line surges when in the voltage doubling mode. Such a line surge could cause the SCR trigger to operate to disable the triac and revert to the direct mode. In the event that a surge was all that occurred, the load connected to the system might be adversely affected, especially if it were a computer load. Transistor 51 is arranged to switch in a delay circuit for the SCR 46 when the triac 44 is conductive. This delay circuit is capacitor 50 which is normally discharged when transistor 51 is conductive and acts to preclude the gate of SCR 46 from responding immediately when the trigger voltage is reached. During start up, no delay is desired in the trigger circuit and the capacitor is "disabled" because transistor 51 is off. Bias for transistor 51 is developed by the current flowing through resistor 42 when SCR 40 conducts.

In operation for line voltages of 120 volts AC, a negative voltage ramp is developed across capacitor 36 during start-up. After a delay of about eight line cycles, the voltage across capacitor 36 will be approximately 6 volts DC. This voltage also appears across series resistors 42, 48 and 49. The resulting current through resistor 48 produces enough voltage across it to trigger SCR 40 into conduction and a current in excess of 10 ma will flow, via SCR 40, into the gate of triac 44. The voltage developed across resistor 42 forward biases transistor 51 into conduction and assures that capacitor 50 discharges through resistor 47. For line voltages under approximately 160 volts, the trigger SCR 46 is not driven conductive. It will be noted that during phase reversals of the AC line, drive current for triac 44 is maintained by the discharge of capacitor 36. Thus triac 44 is maintained in conduction even though the line reverses.

When trigger SCR 46 conducts, it prevents the firing of SCR 40 and triac 44 is not driven conductive (or is driven nonconductive). This occurs at approximately 160 volts, when the current through the divider formed by resistor 57, zener diode 55 and resistor 47, with respect to terminal E is sufficient to develop approximately ½ volt positive gate voltage for SCR 46. When trigger SCR 46 is driven conductive, SCR 40 is inhibited. Thus in effect, the gate drive current for triac 44 is removed and the triac is driven out of conduction, thus opening the conductive link between terminals B and C and causing the network to revert to the direct mode of operation. In this mode, capacitor 36 continues to supply anode to cathode current for SCR 46 despite the line reversal (opposite polarities between polarities C and D) and SCR 46 is latched into conduction. Once the direct mode of operation has been achieved, the line voltage may drop below 160 volts by approximately 120 volts before the voltage doubler mode of operation is again initiated. This hysteresis or delay precludes switching of the circuit back and forth between the direct and doubler mode during short term changes in line voltage.

As mentioned, when the doubler mode is initiated, the current through resistor 42 forward biases transistor 51 into conduction and places capacitor 50 across the gate and cathode of trigger SCR 46, which effectively puts a 30 millisecond delay in the circuit. Thus a single cycle of 150% overvoltage will be tolerated by the SCR trigger without operating.

What is claimed is:
1. An automatic voltage doubler circuit comprising:
   rectifying means coupled to an AC line and selectively operable in either a direct mode or in a voltage doubler mode;
   triac switch means for changing the operating mode of said rectifying means;
   drive means for supplying drive current for driving said triac means into conduction for one polarity of the AC line and for maintaining it in conduction during the opposite polarity of the AC line;
   trigger means responsive to the voltage of said AC line reaching a predetermined level for negating the drive current to said triac means to render said triac means nonconductive and for switching said rectifying means to said direct mode; and
   drive delay means for delaying operation of said drive means upon start up to enable said trigger means to sense the voltage on said AC line.
2. The circuit of claim 1 wherein said trigger means comprises an SCR in series with a self-biasing circuit coupled to said AC line and arranged upon conduction to remove said drive current for said triac means.
3. The circuit of claim 2 wherein said drive delay means includes a resistor and a capacitor.
4. The circuit of claim 3 wherein said drive means includes a rectifier and said capacitor.

5. The circuit of claim 4 wherein said rectifier in said drive means is one of the rectifiers in said rectifying means.

6. The circuit of claim 5 further including trigger delay means operable only in said doubler mode for adding a delay to said trigger means.

7. The circuit of claim 6 wherein said trigger delay means includes a switchable RC circuit that introduces a one cycle delay for line surges of 150% of normal AC line voltage.

8. An automatic voltage doubler circuit comprising:
rectifying means, including a bridge rectifier arrangement, having a direct and a voltage doubler mode of operation, coupled to an AC line;
triac switch means for initiating said doubler mode upon conduction;
triac drive means coupled to said AC line and including a capacitor and one of the rectifiers in said bridge rectifier arrangement for supplying drive current to drive said triac means into conduction during one polarity of said AC line and for maintaining it in conduction during the opposite polarity of said AC line;
SCR trigger means coupled to said AC line operable when said AC line reaches a predetermined level for removing said drive current;
said capacitor in said drive means delaying operation of said drive means upon start up to enable said SCR trigger means to sense the voltage of the AC line; and
trigger delay means operable only in said doubler mode for delaying operation of said trigger means.

* * * * *